(12) United States Patent
Liu

(10) Patent No.: US 10,756,214 B2
(45) Date of Patent: Aug. 25, 2020

(54) FIN PROFILE FOR BULK BASED SILICON-ON-INSULATION FINFET DEVICE

(71) Applicant: Avago Technologies General IP (Singapore) Pte. Ltd., Singapore (SG)

(72) Inventor: Qing Liu, Irvine, CA (US)

(73) Assignee: AVAGO TECHNOLOGIES INTERNATIONAL SALES PTE. LIMITED, Singapore (SG)

(*) Notice: Subject to any disclaimer, the term of this patent is extended or adjusted under 35 U.S.C. 154(b) by 0 days.

(21) Appl. No.: 15/798,291

(22) Filed: Oct. 30, 2017

(65) Prior Publication Data

US 2019/0131445 A1     May 2, 2019

(51) Int. Cl.
| | | |
|---|---|---|
| *H01L 29/78* | (2006.01) | |
| *H01L 29/06* | (2006.01) | |
| *H01L 29/66* | (2006.01) | |
| *H01L 21/308* | (2006.01) | |
| *H01L 21/762* | (2006.01) | |
| *H01L 21/02* | (2006.01) | |
| *H01L 21/311* | (2006.01) | |

(52) U.S. Cl.
CPC ...... *H01L 29/785* (2013.01); *H01L 21/02236* (2013.01); *H01L 21/3081* (2013.01); *H01L 21/76224* (2013.01); *H01L 21/76283* (2013.01); *H01L 29/0649* (2013.01); *H01L 29/0657* (2013.01); *H01L 29/6656* (2013.01); *H01L 29/66795* (2013.01); *H01L 21/0217* (2013.01); *H01L 21/02164* (2013.01); *H01L 21/02271* (2013.01); *H01L 21/31111* (2013.01); *H01L 21/31116* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,349,658 | B1* | 5/2016 | Jacob | H01L 21/845 |
| 9,793,395 | B1* | 10/2017 | Liu | H01L 29/7827 |
| 2011/0250731 | A1* | 10/2011 | Kweskin | H01L 21/67017 |
| | | | | 438/400 |

(Continued)

OTHER PUBLICATIONS

Cheng et al., "Bottom Oxidation through STI(BOTS)—a Novel Approach to Fabricate Dielectric Isolated FinFETs on Bulk Substrates," IEEE Symposium on VLSDI Technology: Digest of Technical Papers, Jun. 2014, 3 pages.

*Primary Examiner* — Moin M Rahman
(74) *Attorney, Agent, or Firm* — Morgan, Lewis & Bockius LLP

(57) ABSTRACT

A semiconductor device includes a substrate, and a semiconductor fin structure formed on the substrate. The semiconductor device also includes a dielectric liner disposed on and in direct contact with a top surface of the substrate and a sidewall of the semiconductor fin structure. The semiconductor device includes a first isolation layer disposed on and in direct contact with a top surface and a sidewall of the dielectric liner. The semiconductor device also includes a second isolation layer disposed on and in direct contact with a top surface of the first isolation layer and a sidewall of the semiconductor fin structure. The semiconductor device also includes an oxide isolation region formed beneath the semiconductor fin structure by oxidation through the second isolation layer.

17 Claims, 4 Drawing Sheets

(56) References Cited

U.S. PATENT DOCUMENTS

| | | | |
|---|---|---|---|
| 2012/0086053 A1* | 4/2012 | Tseng | H01L 29/66795 257/288 |
| 2014/0374838 A1* | 12/2014 | Chen | H01L 27/0886 257/401 |
| 2015/0194350 A1* | 7/2015 | Cai | H01L 21/0217 257/369 |
| 2015/0228668 A1* | 8/2015 | Ponoth | H01L 21/76224 257/350 |

* cited by examiner

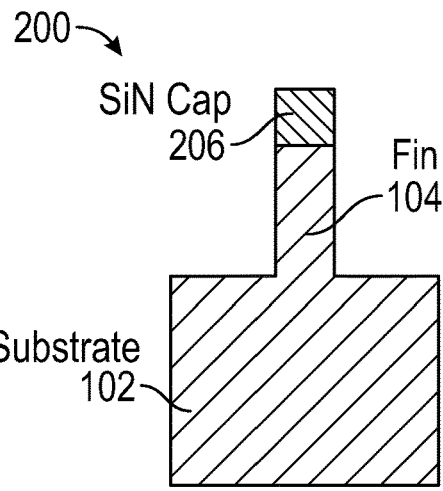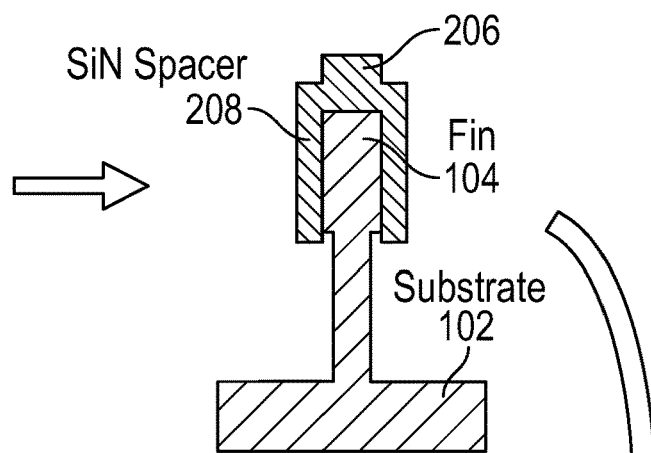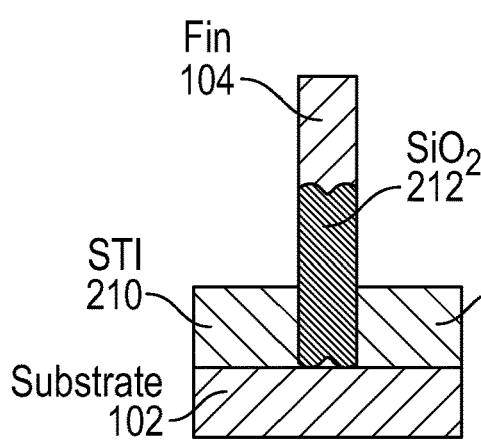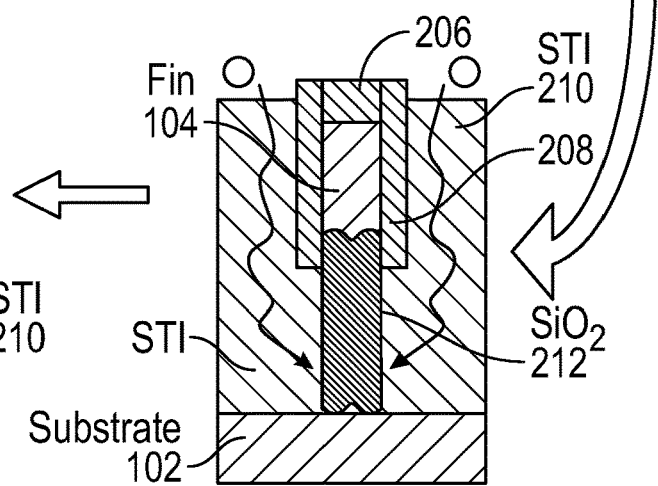
FIG. 2A  FIG. 2B  FIG. 2C  FIG. 2D
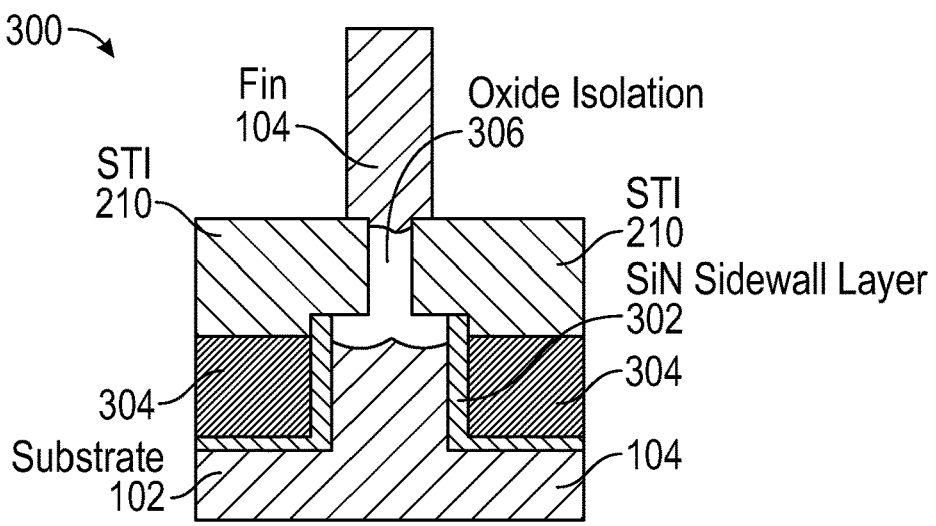
FIG. 3

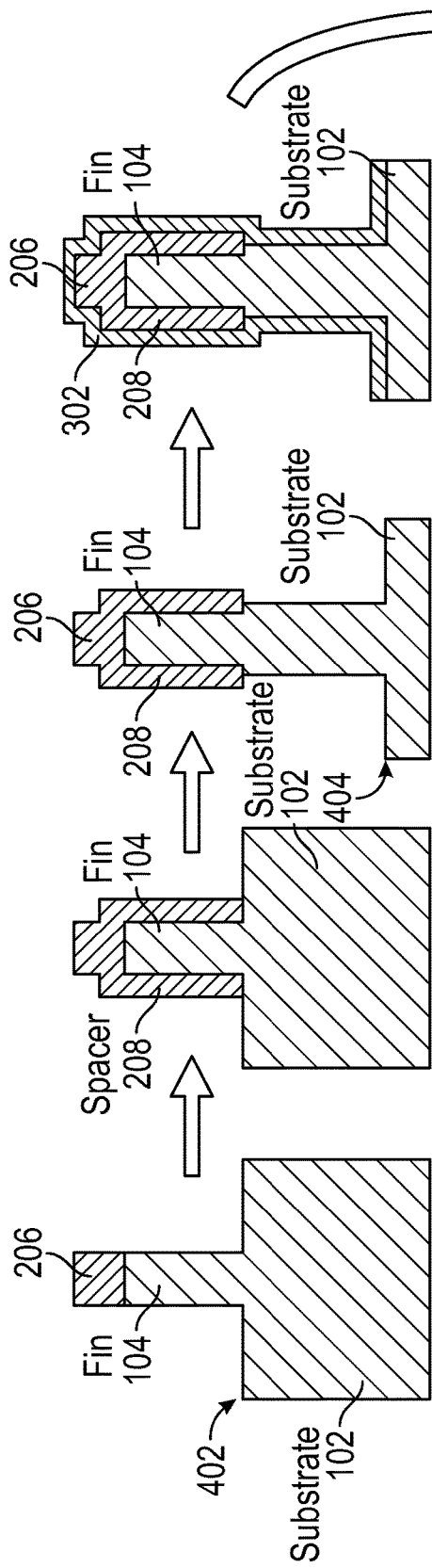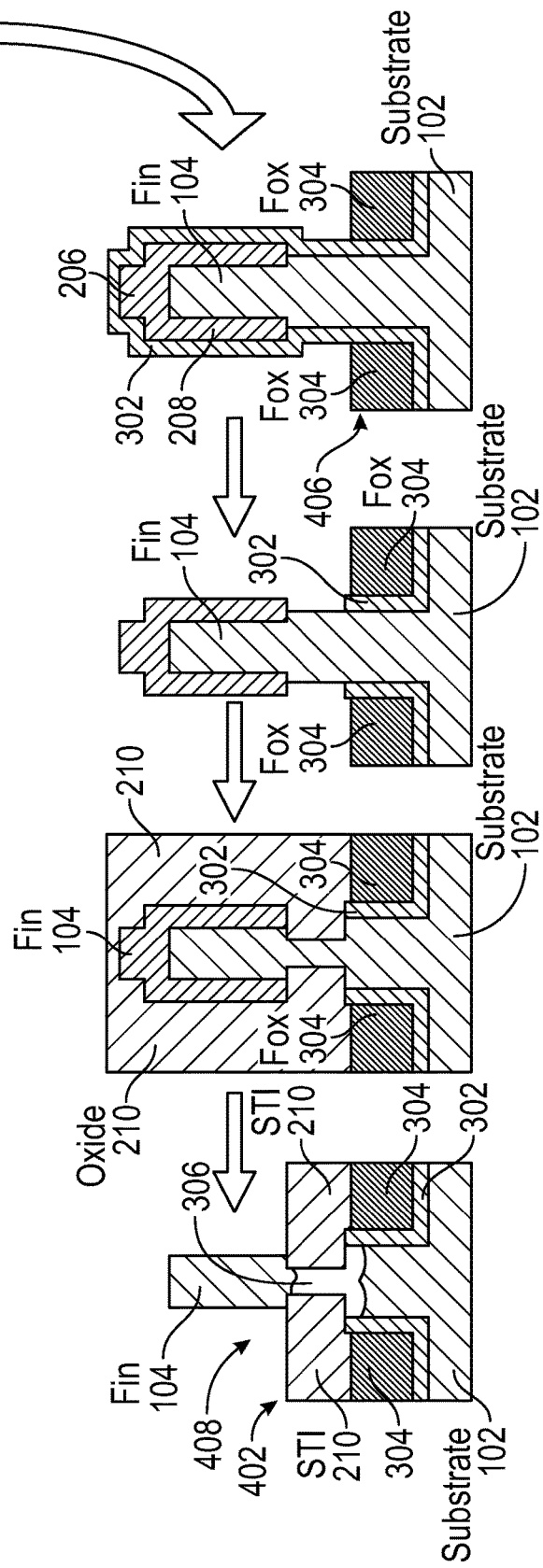

FIN PROFILE FOR BULK BASED SILICON-ON-INSULATION FINFET DEVICE

TECHNICAL FIELD

The present application generally relates to semiconductor devices, and more particularly, but not exclusively, to fin profile and monitor for bulk based silicon-on-insulation (SOI) FinFET device.

BACKGROUND

As semiconductor devices are increasing in layout density, technology scaling has led to development of fin-based, also referred to as FinFET structures as an alternative to bulk metal-oxide-semiconductor FET structures for improved scalability. The FinFET utilizes a semiconductor fin to wrap the conducting channel, and the fin forms the body of the transistor. In effect, the gate electrode of the transistor straddles or surrounds the fin. During operation, current flows between the source and drain terminals along the gated sidewall surfaces of the fin.

Bulk FinFET with dielectric isolation is attractive due to the ever increase of fin density and lower cost of bulk wafers. Bottom oxidation through shallow-trench isolation (BOTS) may be used to make bulk fin dielectric isolation. However, the bottom profile worsens with BOTS, and adversely impacts the monitoring of the fin height using conventional optical critical dimension measurements during the manufacturing of FinFET devices.

BRIEF DESCRIPTION OF THE DRAWINGS

Certain features of the subject disclosure are set forth in the appended claims. However, for purpose of explanation, several implementations of the subject disclosure are set forth in the following figures.

FIGS. 2A-2D illustrate a sequential fabrication process for forming a traditional bulk based SOI FinFET device according to one or more implementations.

FIG. 3 illustrates a cross-sectional view of the bulk based SOI FinFET device with the enhanced fin profile according to one or more implementations.

FIGS. 4A-4H illustrate a sequential fabrication process for forming a bulk based SOI FinFET device with the enhanced fin profile according to one or more implementations.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations.

The present disclosure provides for a semiconductor device includes a substrate, and a semiconductor fin structure formed on the substrate. The semiconductor device also includes a dielectric liner disposed on and in direct contact with a top surface of the substrate and a sidewall of the semiconductor fin structure. The semiconductor device includes a first isolation layer disposed on and in direct contact with a top surface and a sidewall of the dielectric liner. The semiconductor device also includes a second isolation layer disposed on and in direct contact with a top surface of the first isolation layer and a sidewall of the semiconductor fin structure. The semiconductor device also includes an oxide isolation region formed beneath the semiconductor fin structure by oxidation through the second isolation layer.

The subject technology offers several advantages over the traditional bulk based FinFET devices such as preventing irregular bottom shape formation with a BOTS approach. This enables the monitoring and control of fin height in a manufacturing environment. The bottom dielectric liner improves the fin isolation, and can be detectable by semiconductor failure analysis techniques. The bottom dielectric liner profile also improves quality and mobility with no dopant out diffusion from bottom punch-through stopper implant. With greater monitoring and control of fin height during manufacturing, a bulk wafer can be used instead of SOI wafer to minimize semiconductor fabrication costs.

As used herein, the term "substrate" refers to the physical object that is the basic workpiece transformed by various process operations into the desired microelectronic configuration. A typical substrate used for the manufacture of integrated circuits is a wafer. Wafers may be made of semiconducting (e.g., bulk silicon), non-semiconducting (e.g., glass), or combinations of semiconducting and non-semiconducting materials (e.g., SOI). In the semiconductor industry, a bulk silicon wafer is commonly used for the manufacture of integrated circuits.

Figure 1A:
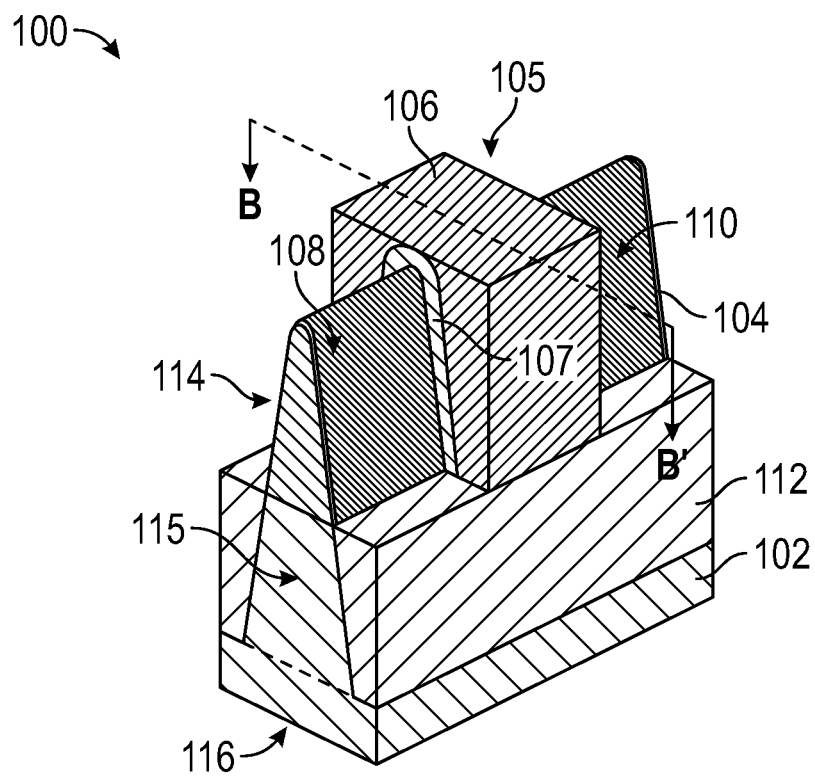
FIGS. 1A-1C illustrate a perspective view of a semiconductor device that includes a traditional FinFET device and cross-sectional views of the semiconductor devices respectively along B-B' in accordance with one or more implementations.
Figure 1B:
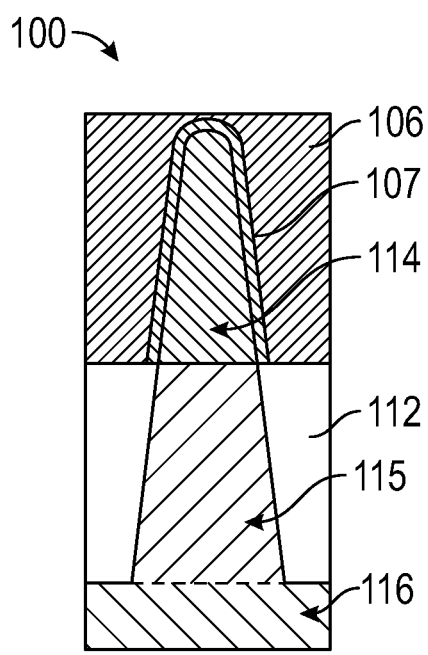
Figure 1C:
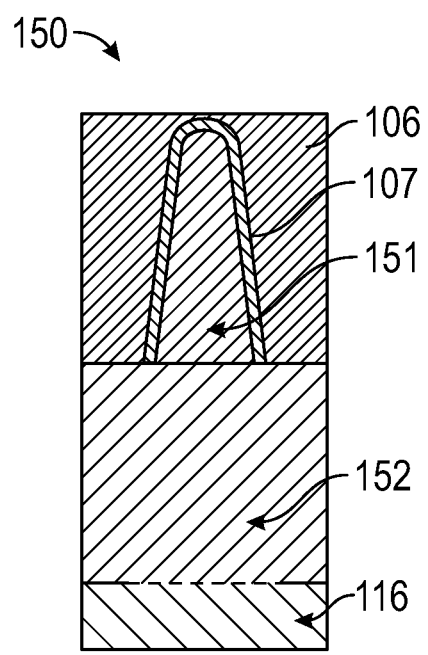

FIGS. 1A-1C illustrate a perspective view of a semiconductor device that includes a traditional FinFET device and cross-sectional views of the FinFET device respectively along B-B' in accordance with one or more implementations. FIG. 1B illustrates a cross-sectional view of a traditional bulk FinFET device 100. FIG. 1C illustrates a cross-sectional view of a traditional SOI FinFET device 150. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

The traditional bulk FinFET device 100 includes a substrate 102 supporting a semiconductor fin structure 104 and a gate structure 105. The semiconductor fin structure 104 includes a source region 108 and a drain region 110. The semiconductor fin structure 104 of FIGS. 1A and 1B contains a bulk semiconductor material. In one or more implementations, the traditional bulk FinFET device 100 includes wells and shallow trench isolation (STI) regions. As shown in FIGS. 1A and 1B, the semiconductor fin structure 104 includes a channel region 114 and a channel stop region 115, and the substrate 102 includes a well region 116. In addition, the traditional bulk FinFET device 100 includes an isolation layer 112. The doping density of the channel region 114 may be different from the doping density of the channel stop region 115. For example, the doping density of the channel stop region 115 may be greater than that of the channel region 114. The doping density of the channel region 114 may be in the range of about $1\times10^{15}$ cm$^{-3}$ to $1\times10^{21}$ cm$^{-3}$. Similarly, the doping density of the channel stop region 115 may be in the range of about $1\times10^{17}$ cm$^{-3}$ to $1\times10^{21}$ cm$^{-3}$. In some implementations, the channel stop region 115 is doped using a punch-through stop (PTS) doping process.

The gate structure 105 is deposited over a portion of the semiconductor fin structure 104 to form the channel region 114 between the source region 108 and the drain region 110. In effect, the gate structure 105 straddles or surrounds the semiconductor fin structure 104. During operation, current flows between the source region 108 and the drain region 110 along the gated sidewall surfaces of the semiconductor fin structure 104. In one or more implementations, the gate structure 105 includes a gate electrode layer 106 and a gate dielectric layer 107 disposed between the gate electrode layer 106 and the channel region 114. The gate structure 105 may include one or more work function gate metal layers (not shown). In one or more implementations, the work function gate metal layers can include, but is not limited to, titanium carbide, titanium aluminide, tantalum nitride, titanium nitride, tungsten nitride, iridium dioxide, among other metals identifiable by a person skilled in the art. The work function gate metal layers may be doped. In one or more implementations, the traditional bulk FinFET device 100 includes epitaxially-grown structures (not shown) formed outside of the gate structure 105, respectively referred to as the source region 108 and the drain region 110. The epitaxially-grown structures may be heavily doped compared to the channel region 114.

Although one semiconductor fin structure 104 is shown in FIGS. 1A and 1B, in one or more implementations, additional semiconductor fin structures can be disposed on the substrate 102. In one or more implementations, the gate structure 105 can straddle or surround a plurality of semiconductor fin structures. In one or more implementations, more than one gate structure can straddle or surround one or more semiconductor fin structures. In one or more implementations, the gate structure 105 is formed using a polysilicon material or a metal.

Because the features described in FIG. 1B are similar to the features of FIG. 1C, only differences between the figures will be described in reference to FIG. 1C. In FIG. 1C, the semiconductor fin structure 104 contains a SOI semiconductor material. As shown in FIG. 1C, the semiconductor fin structure 104 includes a channel region 151 and a buried oxide region 152. The channel region 151 includes the SOI semiconductor material, and the buried oxide region 152 includes oxide material containing oxidation. The process of fabricating the buried oxide region 152 will be discussed in reference to FIGS. 2A-2D.

The traditional bulk FinFET device 100 (FIGS. 1A, 1B) may suffer from device variability due to the PTS doping and STI recess. In contrast, the traditional SOI FinFET device 150 has greater fin height control due in part by the buried oxide region 152.

Either of the traditional bulk FinFET device 100 or the traditional SOI FinFET 150 may be a p-type metal-oxide-semiconductor (PMOS) structure such that the substrate 102 is a p-type substrate made of p-type material. The p-type material may be obtained by a doping process by adding certain types of atoms to the semiconductor (e.g., boron as dopant in silicon substrate) in order to increase the number of positive carriers (e.g., holes). Alternatively, the traditional bulk FinFET device 100 or the traditional SOI FinFET 150 may be an n-type MOS (NMOS) structure such that the substrate 102 is an n-type substrate (e.g., arsenic or phosphorus as dopant in silicon substrate).

Because the physical depictions of the traditional bulk FinFET device 100 and the traditional SOI FinFET 150 are not limited to the implementation shown in FIGS. 1A-1C, the FinFET device 100 may be applicable to double-gate transistors, tri-gate transistors, and various other implementations of semiconductor devices. The FinFET device 100 may be applicable to various technologies including, but not limited to, complementary metal-oxide-semiconductors (CMOS), silicon (Si), strained silicon, silicon-on-insulator (SOI), gallium-arsenide (GaAs), indium-gallium-arsenide (InGaAs), silicon-germanium (SiGe), and other Group IV elements/compounds and Group III-V compounds.

FIGS. 2A-2D illustrate a sequential fabrication process 200 for forming a traditional bulk based SOI FinFET device according to one or more implementations. Further for explanatory purposes, the steps of the sequential fabrication process 200 are described herein as occurring in serial, or linearly. However, multiple steps of the sequential fabrication process 200 may occur in parallel. In addition, the steps of the sequential fabrication process 200 need not be performed in the order shown and/or one or more of the steps of the sequential fabrication process 200 need not be performed.

In FIGS. 2A and 2B, the sequential fabrication process 200 includes providing a substrate 102, and patterning the substrate 102 to form one or more semiconductor fin structures 104 on the substrate 102. In FIG. 2A, the patterning of the substrate 102 includes disposing a mask layer on the substrate 102. In FIG. 2B, the patterning of the substrate 102 includes disposing a spacer on sidewalls of the semiconductor fin structure 104. In some aspects, the spacer is a silicon nitride spacer.

In FIG. 2C, the sequential fabrication process 400 includes forming an isolation layer 210 on and in direct contact with a top surface of the substrate 102 and a sidewall of the semiconductor fin structure 104. The sequential fabrication process 200 includes applying oxidation to the isolation layer 210 to form an oxide isolation region 212 in a portion of the semiconductor fin structure 104 in contact with the isolation layer 210.

In FIG. 2D, the sequential fabrication process 200 includes patterning the second isolation layer 210 to form a conductive region on a portion of the semiconductor fin structure 104. In some aspects, the oxide isolation region 212 is located beneath and in contact with the conductive region.

In order to accurately measure fin height using optical critical dimension measurements and enable control during manufacturing of FinFET devices, a highly regular dielectric bottom layer is formed to isolate the fin structure with an enhanced fin profile. In contrast, traditional bulk FinFET devices that mimic SOI FinFET devices have a bottom shape (or fin profile) that is highly irregular due to the bottom oxidation through STI approach, which hampers fin height measurements.

FIG. 3 illustrates a cross-sectional view of the bulk based SOI FinFET device 300 with the enhanced fin profile according to one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

Because the features described in FIGS. 1A to 1C are similar to the features of FIG. 3, only differences between the figures will be described in reference to FIG. 3. For purposes of simplification, the implementations described in FIG. 3 will be discussed primarily in reference to the substrate 102 and the semiconductor fin structure 104.

The bulk based SOI FinFET device 300 includes a substrate 102, such as a silicon (Si) substrate. The bulk based SOI FinFET device 300 also includes a semiconductor fin structure 104 formed on the substrate 102.

The bulk based SOI FinFET device 300 includes a dielectric liner 302 disposed on and in direct contact with the semiconductor fin structure 104. The dielectric liner 302 is disposed on a top surface of the substrate 102 and in contact with a sidewall of the semiconductor fin structure 104. In one or more implementations, the dielectric liner 302 has a thickness in a range of 2 nm to 4 nm. In some implementations, the dielectric liner 302 contains silicon nitride, however, other suitable dielectric materials may be used to isolate the semiconductor fin structure 104 without departing from the scope of the present disclosure.

The bulk based SOI FinFET device 300 includes a first isolation layer 304 disposed on and in direct contact with the dielectric liner 302. The first isolation layer 304 is disposed on a top surface of the dielectric liner 302 and in contact with a sidewall of the dielectric liner 302. In one or more implementations, the first isolation layer 304 includes a first oxide material. In some aspects, the first oxide material may be referred to as a flowable oxide material due to its porous characteristics.

The bulk based SOI FinFET device 300 includes a second isolation layer 210 disposed on the first isolation layer 304, and the second isolation layer 210 is in contact with the dielectric liner 302 and the semiconductor fin structure 104. For example, the second isolation layer 210 is disposed on a top surface of the first isolation layer 304 and in contact with a sidewall of the semiconductor fin structure 104. In one or more implementations, the second isolation layer 210 includes a second oxide material. In some aspects, the second oxide material is less porous than the first oxide material.

In one or more implementations, a sidewall surface of the dielectric liner 302 is in greater contact with the first isolation layer 304 than with the second isolation layer 210. In one or more implementations, a first portion of the semiconductor fin structure 104 in direct contact with the second isolation layer 210 has a first width, and a second portion of the semiconductor fin structure 104 in direct contact with the dielectric liner 302 has a second width. In some aspects, the second width is greater than the first width.

The semiconductor fin structure 104 includes an oxide isolation region 306 that is in contact with a sidewall and a bottom surface of the second isolation layer 210 and a sidewall of the dielectric liner 302. Although the oxide isolation region 306 has an irregular bottom shape, the fin profile of the semiconductor fin structure 104 is based on the presence of the dielectric liner 302 providing a highly regular bottom shape that enables more accurate fin height measurements.

FIGS. 4A-4H illustrate a sequential fabrication process 400 for forming a bulk based SOI FinFET device with the enhanced fin profile according to one or more implementations. Further for explanatory purposes, the steps of the sequential fabrication process 400 are described herein as occurring in serial, or linearly. However, multiple steps of the sequential fabrication process 400 may occur in parallel. In addition, the steps of the sequential fabrication process 400 need not be performed in the order shown and/or one or more of the steps of the sequential fabrication process 400 need not be performed.

In FIGS. 4A to 4C, the sequential fabrication process 400 includes providing a substrate (e.g., 102), and patterning the substrate 102 to form one or more semiconductor fin structures (e.g., 104) on the substrate 102. In one or more implementations, the patterning of the substrate 102 also includes disposing a mask layer (e.g., 206) on the substrate. In one or more implementations, the mask layer (e.g., 206) is a hardmask material that is deposited and patterned using semiconductor fabrication techniques to form hardmask mandrels (not shown) on the top surface of the substrate 102. In one or more implementations, the patterning is performed using sidewall image transfer (SIT). The hardmask material can be, by way of example and not of limitation, oxide (e.g., silicon oxide) or nitride (e.g., silicon nitride). In some aspects, the mask layer is a Silicon Nitride (SiN) cap. The mask layer 206 may have a height approximately in a range of 20 nm to 40 nm.

In one or more implementations, etching is performed on the substrate 102 to remove one or more portions of the substrate 102 based on locations of the hardmask mandrels. In this regard, the substrate 102 is patterned by an etch operation to form one or more recessed regions in the substrate 102, after which the hardmask mandrels are removed.

In one or more implementations, the patterning of the substrate 102 includes recessing the substrate 102 to a first depth (e.g., 402) by a first etch operation (e.g., wet or dry etching) based on the disposed mask layer (e.g., 206). In some aspects, the remaining portion of the substrate excluded from being recessed represents the semiconductor fin structure (e.g., 104). The semiconductor fin structure may have a height approximately in a range of 30 nm to 70 nm.

In FIGS. 4D to 4F, the sequential fabrication process 400 includes forming a dielectric liner (e.g., 302) on and in direct contact with a top surface of the substrate and a sidewall of the semiconductor fin structure 104. In one or more implementations, the forming of the dielectric liner 302 includes forming a spacer (e.g., 208) on a sidewall of the semiconductor fin structure 104, and recessing the substrate 102 to a second depth (e.g., 404) by a second etch operation (e.g., dry etch) based on the formed spacer 208. In some aspects, a first distance from a top surface of the semiconductor fin structure 104 to the first depth 402 is smaller than a second distance from the top surface of the semiconductor fin structure to the second depth 404. The first distance may be in a range of about 30 nm to 70 nm, and the second distance may be in a range of about 100 nm to 200 nm. The spacer may have a thickness approximately in a range of 6 nm to 12 nm.

In one or more implementations, the forming of the dielectric liner 302 also includes disposing a nitride material on a top surface of the substrate 102 at the second depth 404 and on the semiconductor fin structure 104. For example, the dielectric liner 302 may be disposed on the top surface and sidewalls of the semiconductor fin structure 104.

In FIG. 4E, the sequential fabrication process 400 includes forming a first isolation layer 304 on and in direct contact with a top surface and a sidewall of the dielectric liner 302. In one or more implementations, the forming of the first isolation layer 304 also includes disposing a first oxide material on the disposed nitride material. The first isolation layer may have a height approximately in a range of 50 nm to 80 nm.

In one or more implementations, the first oxide material can be deposited utilizing a pressure controlled process, although other suitable deposition processes may be utilized such as a molecular vapor deposition (MVD) process. The first oxide material may be an oxide suitable for filling the trenches between formed (or patterned) semiconductor fin structures. The first oxide material may have a low etch rate (such as a low hydrofluoric acid etch rate). Silicon dioxide ($SiO_2$) is generally used as the oxide material, although other suitable oxides can be used. The first oxide material can be deposited utilizing a process such as a chemical vapor deposition (CVD), low pressure chemical vapor deposition (LPCVD), molecular layer deposition (MLD), among others.

In one or more implementations, the forming of the dielectric liner 302 also includes recessing the first oxide material to a third depth (e.g., 406) by a third etch operation (e.g., dry etch) to form the first isolation layer 304. In some aspects, a third distance from the top surface of the semiconductor fin structure 104 to the third depth 406 is greater than the first distance and smaller than the second distance. The third distance may be in a range of about 50 nm to 120 nm.

In FIG. 4F, the sequential fabrication process 400 also includes removing the nitride material from the semiconductor fin structure 104 between the top surface of the semiconductor fin structure 104 and the third depth 406 by a fourth etch operation (e.g., wet etch) to form the dielectric liner 302. In one aspect, the wet etch operation may be performed using phosphorous acid.

In FIG. 4G, the sequential fabrication process 400 also includes recessing a portion of the semiconductor fin structure 104 between the first depth 402 and the third depth 406 by the fourth etch operation to modify the semiconductor fin structure 104 from a first width to a second width. In some aspects, the second width is smaller than the first width. In some aspects, the distance between the first depth and third depth that is recessed is approximately in a range of 20 nm to 50 nm.

In FIG. 4G, the sequential fabrication process 400 includes forming a second isolation layer 210 on and in direct contact with a top surface of the first isolation layer 304 and a sidewall of the semiconductor fin structure 104. In one or more implementations, the forming of the second isolation layer 210 includes disposing a second oxide material on the disposed first oxide material. In some aspects, the second oxide material is less porous than the first oxide material. For example, the second oxide material may be non-porous.

In one or more implementations, the shallow-trench isolation regions (e.g., 210) include one or more layers of a high-k dielectric material and/or an oxide insulator material. For example, one or more layers of the second oxide material are deposited into the recessed region. The one or more layers of the second oxide material may be recessed as part of a STI process. The thickness of the recessed oxide material can be between 30 nm and 300 nm depending on implementation. The high-k dielectric material can include, but is not limited to, hafnium oxide, hafnium silicon oxide, lanthanum oxide, lanthanum aluminum oxide, yttrium oxide, lead zinc niobate, among other high-k dielectric materials identifiable by a person skilled in the art.

In FIGS. 4G and 4F, the sequential fabrication process 400 includes applying oxidation to the second isolation layer 210 to form an oxide isolation region (e.g., 306) in a portion of the semiconductor fin structure 104 that is in contact with the second isolation layer 210. In this respect, the oxidation applied to the second isolation layer 210 spreads through the second isolation layer 210 and impinges upon the sidewalls of the semiconductor fin structure 104 to thereby penetrate through the body of the semiconductor fin structure 104 and form the oxide isolation region 306. In some implementations, the oxide isolation region 306 contains an amount of oxidation that corresponds to that of the second oxide material (i.e., contain relatively the same amount). In some aspects, the formation of the oxide isolation region 306 is similar to the bottom oxidation through STI approach.

In FIG. 4F, the sequential fabrication process 400 includes patterning the second isolation layer 210 to form a conductive region (e.g., 408) on a portion of the semiconductor fin structure. In some aspects, the oxide isolation region 306 is located beneath and in contact with the conductive region 408.

In some aspects, the shallow-trench isolation regions (e.g., 210) may be disposed into recessed regions formed in the substrate 102. For example, a first shallow-trench isolation region may be disposed adjacent to and in contact with a first sidewall of the semiconductor fin structure 104 and a second shallow-trench isolation region may be disposed adjacent to and in contact with a second sidewall of the semiconductor fin structure 104.

In some implementations, the patterning of the second isolation layer 210 includes recessing the second oxide material to the first depth 402 by a fifth etch operation (e.g., dry etch or wet etch). In some aspects, the spacer 208 and remaining portion of the mask layer 206 are removed based on the fifth etch operation.

Figure 5:
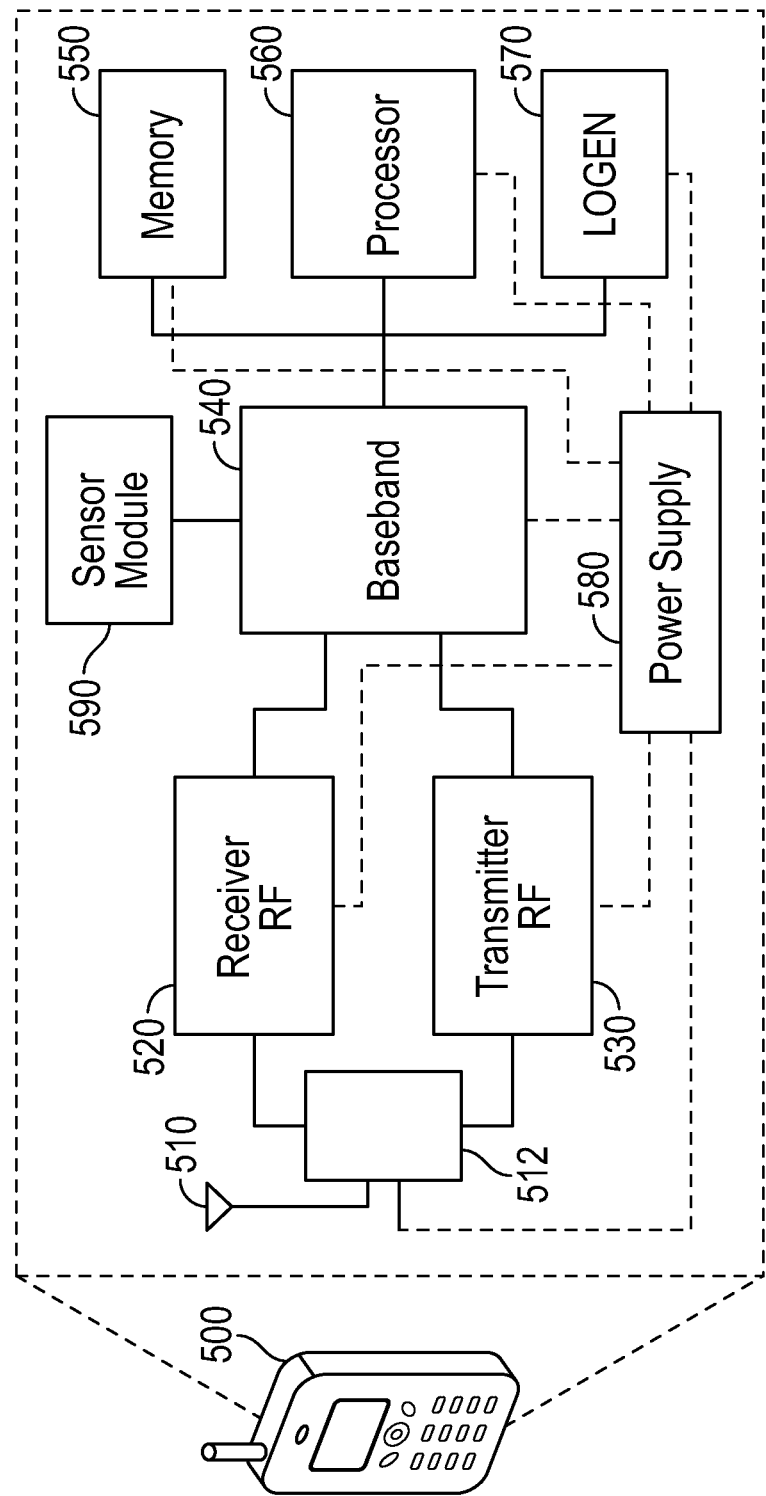
FIG. 5 illustrates an example of a wireless communication device employing features of the subject technology in accordance with one or more implementations of the subject technology.

FIG. 5 illustrates an example of a wireless communication device 500 employing features of the subject technology in accordance with one or more implementations of the subject technology. The wireless communication device 500 includes a radio-frequency (RF) antenna 510, a receiver 520, a transmitter 530, a baseband processing module 540, a memory 550, a processor 560, a local oscillator generator (LOGEN) 570, a power supply 580 and a sensor module 590. In various embodiments of the subject technology, one or more of the blocks represented in FIG. 5 can be integrated on one or more semiconductor substrates. For example, the blocks 520-670 can be realized in a single chip or a single system on chip, or can be realized in a multi-chip chipset.

The RF antenna 510 can be suitable for transmitting and/or receiving RF signals (e.g., wireless signals) over a wide range of frequencies. Although a single RF antenna 510 is illustrated, the subject technology is not so limited.

The receiver 520 comprises suitable logic circuitry and/or code that can be operable to receive and process signals from the RF antenna 510. The receiver 520 may, for example, be operable to amplify and/or down-convert received wireless signals. In various embodiments of the subject technology, the receiver 520 is operable to cancel noise in received signals and can be linear over a wide range of frequencies. In this manner, the receiver 520 is suitable for receiving signals in accordance with a variety of wireless standards such as Wi-Fi, WiMAX, Bluetooth, and various cellular standards.

The transmitter 530 comprises suitable logic circuitry and/or code that can be operable to process and transmit signals from the RF antenna 510. The transmitter 530 may, for example, be operable to up-convert baseband signals to RF signals and amplify RF signals. In various embodiments of the subject technology, the transmitter 530 is operable to up-convert and to amplify baseband signals processed in accordance with a variety of wireless standards. Examples of such standards include Wi-Fi, WiMAX, Bluetooth, and various cellular standards. In various embodiments of the subject technology, the transmitter 530 is operable to provide signals for further amplification by one or more power amplifiers.

In some implementations, the transmitter 530 includes an RF power amplifier that can be a high-voltage power amplifier fabricated using the LDMOS device (e.g. as shown in FIG. 1C or 5.C) of the subject technology.

The duplexer 512 provides isolation in the transmit band to avoid saturation of the receiver 520 or damaging parts of the receiver 520, and to relax one or more design requirements of the receiver 520. Furthermore, the duplexer 512 can attenuate the noise in the receive band. The duplexer is operable in multiple frequency bands of various wireless standards.

The baseband processing module 540 comprises suitable logic, circuitry, interfaces, and/or code that can be operable to perform processing of baseband signals. The baseband processing module 540 may, for example, analyze received signals and generate control and/or feedback signals for configuring various components of the wireless communication device 500 such as the receiver 520. The baseband processing module 540 is operable to encode, decode, transcode, modulate, demodulate, encrypt, decrypt, scramble, descramble, and/or otherwise process data in accordance with one or more wireless standards.

The processor 560 comprises suitable logic, circuitry, and/or code that can enable processing data and/or controlling operations of the wireless communication device 500. In this regard, the processor 560 is enabled to provide control signals to various other portions of the wireless communication device 500. The processor 560 can also control transfers of data between various portions of the wireless communication device 500. Additionally, the processor 560 can enable implementation of an operating system or otherwise execute code to manage operations of the wireless communication device 500.

The memory 550 comprises suitable logic, circuitry, and/or code that can enable storage of various types of information such as received data, generated data, code, and/or configuration information. The memory 550 includes, for example, RAM, ROM, flash, and/or magnetic storage. In various embodiment of the subject technology, the memory 550 may include a RAM, DRAM, SRAM, T-RAM, Z-RAM, TTRAM, or any other storage media.

In some implementations, the memory 550 includes a memory chip (e.g., 500 of FIG. 5) including a bitcell process monitor (e.g., 520 of FIG. 5) that provides process variation information including process corners to an assist circuitry (e.g., 514 of FIG. 4) of the memory chip. The assist circuitry can use the process corners as well as temperature corners provided by a temperature monitor to improve performance of the memory 550, for example, by enabling low-voltage mode of operation of the memory 550, which results in lower power consumption and longer lifetime of the memory 550.

The local oscillator generator (LOG EN) 570 comprises suitable logic, circuitry, interfaces, and/or code that can be operable to generate one or more oscillating signals of one or more frequencies. The LOGEN 570 can be operable to generate digital and/or analog signals. In this manner, the LOGEN 570 can be operable to generate one or more clock signals and/or sinusoidal signals. Characteristics of the oscillating signals such as the frequency and duty cycle can be determined based on one or more control signals from, for example, the processor 560 and/or the baseband processing module 540.

In operation, the processor 560 can configure the various components of the wireless communication device 500 based on a wireless standard according to which it is desired to receive signals. Wireless signals can be received via the RF antenna 510 and amplified and down-converted by the receiver 520. The baseband processing module 540 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 550, and/or information affecting and/or enabling operation of the wireless communication device 500. The baseband processing module 540 can modulate, encode and perform other processing on audio, video, and/or control signals to be transmitted by the transmitter 530 in accordance to various wireless standards.

In some implementations, the sensor module 490 includes one or more sensors, such as touch sensors that receive touch signals from a touch screen of the wireless communication device 400. In some aspects, the touch sensor module 490 includes sensor circuits including, for example, sensor drivers and other circuitry that use high breakdown voltage LDMOS of the subject technology.

As used herein, the terms "chip," "die," "integrated circuit," "semiconductor device," are applicable to the subject technology as these terms can be used interchangeably in the field of electronics. With respect to a chip, power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips can be made by way of electrical conductors, chips and other circuit elements may alternatively be coupled by way of, but not limited to, optical, mechanical, magnetic, electrostatic, and electromagnetic interfaces.

In the semiconductor industry environment of foundries and fabless companies, it is the foundries that develop, specify and provide the physical structures that designers use to implement their designs. Foundries provide manufacturing services to many fabless semiconductor companies, but to operate profitably, they must optimize their manufacturing processes to achieve high yields. Such optimizations typically require that limitations be placed on the variety of structures that can be produced by a particular manufacturing process. Foundries typically provide a limited set of transistor structures that are intended to cover a broad range of circuit applications.

One or more implementations are performed by one or more integrated circuits, such as application specific integrated circuits (ASICs) or field programmable gate arrays (FPGAs). In one or more implementations, such integrated circuits execute instructions that are stored on the circuit itself. The term "integrated circuit" or "semiconductor device" may include, but is not limited to, a design tool output file as binary code encompassing the overall physical design of the integrated circuit or semiconductor device, a data file encoded with code representing the overall physical design of the integrated circuit or semiconductor device, a packaged integrated circuit or semiconductor device, or an unpackaged die. The data file can include elements of the integrated circuit or semiconductor device, interconnections of those elements, and timing characteristics of those elements (including parasitics of the elements).

The various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

Terms such as "top," "bottom," "above," "below," "beneath," "side," "horizontal," "vertical," and the like refer to an arbitrary frame of reference, rather than to the ordinary gravitational frame of reference. Thus, such a term may extend upwardly, downwardly, diagonally, or horizontally in a gravitational frame of reference.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. Such disclosure may provide one or more examples. A phrase such as an aspect may refer to one or more aspects and vice versa, and this applies similarly to other phrases.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A semiconductor device, comprising:
    a substrate;
    a semiconductor fin structure disposed on the substrate, the semiconductor fin structure having a first fin portion with first opposite sidewalls spaced apart by a first width, a second fin portion on top of the first fin portion with second opposite sidewalls spaced apart by a second width smaller than the first width, and a third fin portion on top of the second fin portion with third opposite sidewalls spaced apart by a third width greater than the second width;
    a dielectric liner disposed on and in direct contact with the first opposite sidewalls of the semiconductor fin structure;
    a first isolation layer disposed on and in direct contact with the dielectric liner; and
    a second isolation layer disposed on the first isolation layer, the second isolation layer being in contact with the dielectric liner and with the second opposite sidewalls of the semiconductor fin structure, the third opposite sidewalls being located above a top surface of the second isolation layer,
    wherein the semiconductor fin structure further comprises an oxide isolation region that is in contact with a sidewall and a bottom surface of the second isolation layer and a sidewall of the dielectric liner.

2. The semiconductor device of claim 1, wherein the dielectric liner is disposed on a top surface of the substrate and in contact with a sidewall of the semiconductor fin structure.

3. The semiconductor device of claim 1, wherein the dielectric liner has a thickness in a range of 2 nm to 4 nm.

4. The semiconductor device of claim 1, wherein the first isolation layer is disposed on a top surface of the dielectric liner and in contact with a sidewall of the dielectric liner.

5. The semiconductor device of claim 1, wherein the second isolation layer is disposed on a top surface of the first isolation layer and in contact with a sidewall of the semiconductor fin structure.

6. The semiconductor device of claim 1, wherein a sidewall surface of the dielectric liner is in greater contact with the first isolation layer than with the second isolation layer.

7. The semiconductor device of claim 1, wherein a first portion of the semiconductor fin structure in direct contact with the second isolation layer has a first surface width, wherein a second portion of the semiconductor fin structure in direct contact with the dielectric liner has a second surface width, and wherein the second surface width is greater than the first surface width.

8. The semiconductor device of claim 1, wherein the dielectric liner comprises silicon nitride.

9. The semiconductor device of claim 1, wherein the first isolation layer comprises a first oxide material, wherein the second isolation layer comprises a second oxide material, and wherein the second oxide material is less porous than the first oxide material.

10. A semiconductor device, comprising:
    a substrate;

a semiconductor fin structure disposed on the substrate, the semiconductor fin structure having a first fin portion with first opposite sidewalls spaced apart by a first width, a second fin portion on top of the first fin portion with second opposite sidewalls spaced apart by a second width smaller than the first width, and a third fin portion on top of the second fin portion with third opposite sidewalls spaced apart by a third width greater than the second width;

a dielectric liner disposed on and in direct contact with a top surface of the substrate and with the first opposite sidewalls of the semiconductor fin structure;

a first isolation layer disposed on and in direct contact with a top surface and a sidewall of the dielectric liner; and a second isolation layer disposed on and in direct contact with a top surface of the first isolation layer and with the second opposite sidewalls of the semiconductor fin structure, the third opposite sidewalls being located above a top surface of the second isolation layer, wherein the semiconductor fin structure comprises an oxide isolation region that is in contact with a sidewall and a bottom surface of the second isolation layer and a sidewall of the dielectric liner.

11. The semiconductor device of claim 10, wherein a first portion of the semiconductor fin structure in direct contact with the second isolation layer has a first surface width, wherein a second portion of the semiconductor fin structure in direct contact with the dielectric liner has a second surface width, and wherein the second surface width is greater than the first surface width.

12. The semiconductor device of claim 10, wherein the dielectric liner is in direct contact with a sidewall of the first isolation layer and in direct contact with a sidewall and a bottom surface of the second isolation layer.

13. A semiconductor device, comprising:
a substrate;
a semiconductor fin structure disposed on the substrate, the semiconductor fin structure having a first fin portion with first opposite sidewalls spaced apart by a first width, a second fin portion on top of the first fin portion with second opposite sidewalls spaced apart by a second width smaller than the first width, and a third fin portion on top of the second fin portion with third opposite sidewalls spaced apart by a third width greater than the second width;

a first isolation layer;

a dielectric liner interposed between the substrate and the first isolation layer, the dielectric liner being in direct contact with a top surface of the substrate and with the first opposite sidewalls of the semiconductor fin structure, wherein the first isolation layer is disposed on and in direct contact with a top surface and a sidewall of the dielectric liner; and a second isolation layer in contact with a dielectric layer and with the second opposite sidewalls of the semiconductor fin structure, the third opposite sidewalls being located above a top surface of the second isolation layer, wherein the semiconductor fin structure comprises an oxide isolation region that is in contact with a sidewall and a bottom surface of the second isolation layer and a sidewall of the dielectric liner.

14. The semiconductor device of claim 13, wherein the second isolation layer disposed on and in direct contact with a top surface of the first isolation layer.

15. The semiconductor device of claim 14, wherein a first portion of the semiconductor fin structure in direct contact with the second isolation layer has a first surface width, wherein a second portion of the semiconductor fin structure in direct contact with the dielectric liner has a second surface width, and wherein the second surface width is greater than the first surface width.

16. The semiconductor device of claim 14, wherein the dielectric liner is in direct contact with a sidewall of the first isolation layer and in direct contact with a sidewall and a bottom surface of the second isolation layer.

17. The semiconductor device of claim 14, wherein the first isolation layer comprises a first oxide material, wherein the second isolation layer comprises a second oxide material, and wherein the second oxide material is less porous than the first oxide material.

* * * * *